(12) United States Patent
Buynoski et al.

(10) Patent No.: US 6,724,087 B1
(45) Date of Patent: Apr. 20, 2004

(54) LAMINATED CONDUCTIVE LINES AND METHODS OF FORMING THE SAME

(75) Inventors: Matthew S. Buynoski, Palo Alto, CA (US); Paul R. Besser, Sunnyvale, CA (US); Sergey D. Lopatin, Santa Clara, CA (US); Lu You, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/331,682

(22) Filed: Dec. 30, 2002

Related U.S. Application Data
(60) Provisional application No. 60/399,874, filed on Jul. 31, 2002.

(51) Int. Cl.[7] .......................... H01L 23/48; H01L 23/52; H01L 29/40

(52) U.S. Cl. ........................................ 257/762; 257/751

(58) Field of Search ................................. 257/762, 751, 257/767, 750

(56) References Cited

U.S. PATENT DOCUMENTS

| | | | | |
|---|---|---|---|---|
| 4,514,751 | A | * | 4/1985 | Bhattacharya |
| 4,985,750 | A | * | 1/1991 | Hoshino |
| 5,272,376 | A | * | 12/1993 | Ueno |
| 6,228,767 | B1 | * | 5/2001 | Yakura |
| 6,346,745 | B1 | * | 2/2002 | Nogami et al. |
| 6,424,036 | B1 | * | 7/2002 | Okada |
| 6,433,429 | B1 | * | 8/2002 | Stamper |
| 6,518,668 | B2 | * | 2/2003 | Cohen |
| 6,534,863 | B2 | * | 3/2003 | Walker et al. |
| 6,590,288 | B1 | * | 7/2003 | Woo et al. |

\* cited by examiner

*Primary Examiner*—S. V. Clark
(74) *Attorney, Agent, or Firm*—Foley & Lardner

(57) ABSTRACT

A method of fabricating an integrated circuit can include forming a laminated conductive line. The laminated conductive line can be formed in a dielectric trench. The laminated conductive line can include alternating barrier layers and copper layers. An integrated circuit includes at least one interconnect layer, the interconnect layer including a number of conductive lines. Each of the conductive lines includes a first thin barrier layer, a first thin copper layer, a second thin barrier layer and a second thin copper layer. The layered or laminated structure can reduce unconstrained void formation.

24 Claims, 4 Drawing Sheets

LAMINATED CONDUCTIVE LINES AND METHODS OF FORMING THE SAME

This application claims priority to provisional application 60/399,874, filed Jul. 31, 2002, which is incorporated herein by reference in its entirety.

FIELD OF THE INVENTION

The present invention relates generally to integrated circuits (IC) and methods of manufacturing integrated circuits. More particularly, the present invention relates to conductive lines and methods of forming conductive lines.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of IC devices on an IC, there is still a need to decrease the size of IC device features, and, thus, increase the number of devices on an IC. Nevertheless, there are many factors that make the continued miniaturization of ICs difficult. For example, as the size of vias (or pathways between integrated circuit layers used to electrically connect separate conductive layers) decreases, electrical resistance increases.

Conventional integrated circuits utilize vias to connect structures (e.g., gates, drain regions, source regions) and conductive lines. For example, a via can connect a gate above the substrate to a conductive line in a metal 1 layer; Vias can also interconnect conductive lines. For example, a via can connect a conductive line in a metal 1 layer to conductive line in a metal 2 layer. A via is typically a metal plug which extends through an insulative layer in a multilayer integrated circuit. Vias and barrier layers are discussed in U.S. Pat. Nos. 5,646,448; 5,770,519; and 5,639,691; each of which are assigned to the assignee of the present application.

A barrier layer is used to protect the via and insulative layer from metal diffusion and the via and conductive line from electromigration (EM). The barrier layer can contribute significantly to resistance associated with the via metal. Electromigration is the mass transport due to momentum exchange between conducting electrons and diffusing metal atoms. Electromigration causes progressive damage to the metal conductors in an integrated circuit. In general, metals are most susceptible to electromigration at very high current density and temperatures of 100° C. or more.

Electromigration failures have been described by Stanley Wolf, Ph.D. in *Silicon Processing for the VLSI Era*, Lattice Press, Sunset Beach, California, Vol. 2, pp. 264–65 (1990). Dr. Wolf explains that a positive divergence of the motion of the ions of a conductor leads to an accumulation of vacancies, forming a void in the metal. Such voids may ultimately grow to a size that results in open-circuit failure of the conductive line.

Conventional conductive lines have utilized thin layers (e.g., approximately 4,000 Angstroms (Å) thick) of aluminum or an alloy of aluminum. The conductive lines may also be fabricated with copper to reduce susceptibility to electromigration.

Other conventional conductive lines have utilized pure copper or copper alloy lines formed in a damascene process. According to a conventional damascene process, copper lines are filled by electroplating a trench in a dielectric layer. The dielectric layer is typically covered by a barrier and/or a seed layer before electroplating to fill the trench with copper. After the trench is filled with copper, a barrier layer is provided above a copper conductive line and a subsequent interlevel dielectric layer is provided.

Conventional metal lines or interconnect structures, especially copper line structures, can be subject to unconstrained void formation. Unconstrained void formation can be problematic throughout the conductive line, but is particularly problematic near vias and in longer conductive lines (e.g., lines having a length greater than a critical path length).

Unconstrained void formation is a mechanical and electrical phenomenon of electromigration. Unconstrained void formation occurs when a void forms and propagates through the line (i.e., holes grow in the molecular structure associated with the copper material). The voids can create open circuits that lead to integrated circuit device failure.

Thus, there is a need for a conductive line that is more resistant to unconstrained void formation. Further, there is a need for a method of forming a conductive line that is resistant to unconstrained void formation. Even further, there is a need for a copper line structure that utilizes barrier layer properties to reduce unconstrained void formation. Yet further, there is a need for a method of fabricating a copper line that utilizes barrier layer properties to reduce unconstrained void formation.

SUMMARY OF THE INVENTION

An exemplary embodiment is related to an integrated circuit. The integrated circuit includes at least one interconnect layer. The interconnect layer includes a number of conductive lines. Each of the conductive lines includes at least two pairs of a first layer containing copper and a second layer containing a barrier material.

According to another exemplary embodiment, the conductive lines can be disposed in a trench in a dielectric material. At least one of the conductive lines can extend into a second trench to form a conductive via. The pairs can have a V-shaped or U-shaped cross-sectional area at a point where the pair extends into the second trench.

Still another exemplary embodiment relates to a laminated conductive line for an interconnect layer of an integrated circuit. The laminated conductive line includes a first thin barrier layer above a bottom of a dielectric trench and a first thin copper layer above and in contact with the first thin barrier layer; The laminated conductive line can also include a second thin barrier layer above and in contact with the first thin copper layer and a second thin copper layer above and in contact with the second thin barrier layer.

Still yet another embodiment relates to a method of forming a laminated conductive line for an integrated circuit. The method includes providing a first barrier layer, providing a first copper layer, providing a second barrier metal layer, and providing a second copper layer.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
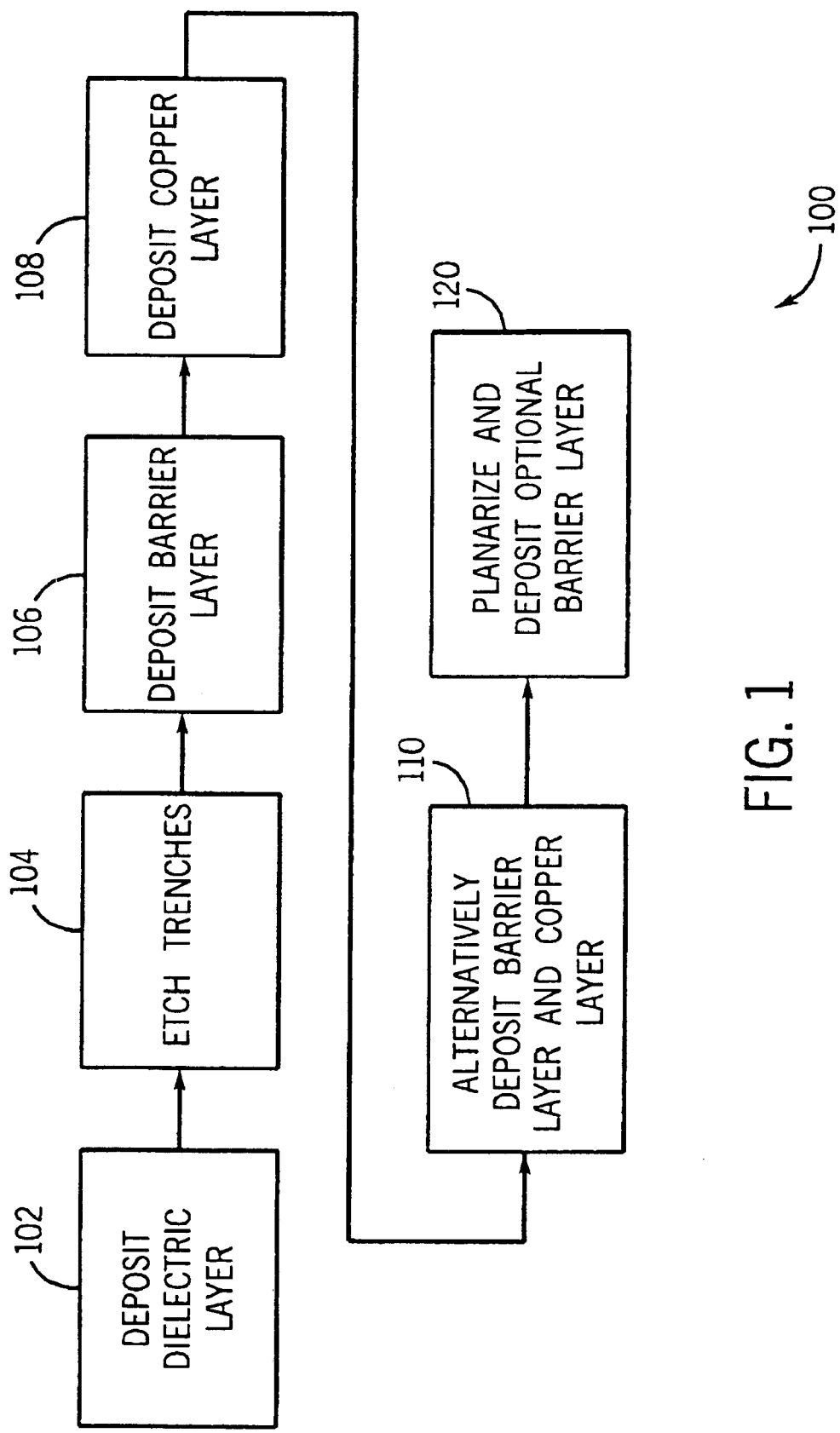
FIG. 1 is a general process flow diagram of a process for forming a laminated conductive line in accordance with an exemplary embodiment.

With reference to FIG. 1, an advantageous process 100 for forming a conductive line that is less susceptible to unconstrained void formation is disclosed. Process 100 utilizes a layered or laminated conductive line structure including copper layers (and/or copper alloy) layers and barrier layers. Applicants have observed that unconstrained void formation generally does not occur at the bottom of vias where barrier layers separate the conductive material in the conductive via from the conductive line beneath it. Applicants have applied this concept to conductive line formation to constrain void formation. Applicants believe that the presence of barrier materials (e.g., tantalum) constrains void formation and interferes with the spreading and propagation of voids through the metal line.

Process 100 includes a dielectric layer formation step 102, a trench formation step 104, a barrier layer formation step 106 and a conductive layer formation step 108. Process 100 can further include alternately forming barrier and conductive layers at a step 110 and a planarization step 120. In step 120, an optional barrier layer can be deposited above the laminated conductive line structure formed in steps 106, 108 and 110.

Process 100 can include forming vias to connect conductive lines to other conductive lines or structures associated with the substrate and contact pads. The vias can be formed by etching holes through interlevel dielectric layers. The holes can be filled in accordance with steps 106, 108 and 110 to provide a laminated conductive via structure. In one embodiment, the laminated via structure is integral with a laminated conductive line.

Figure 2:
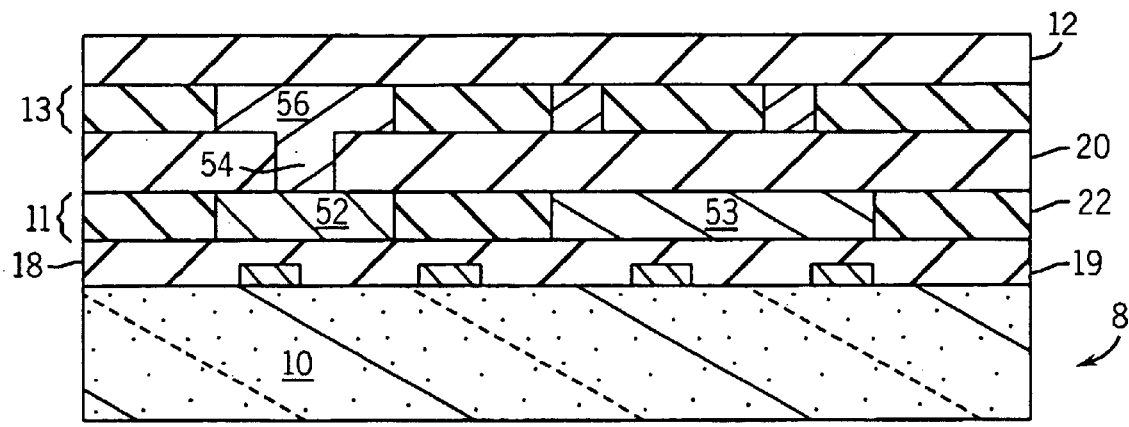
FIG. 2 is a general schematic diagram of a cross-sectional view of an integrated circuit including an interconnect layer with conductive lines in accordance with an exemplary embodiment of the present invention.

With reference to FIGS. 2–8, process 100 (FIG. 1) will be described below. In FIG. 2, a portion 8 of an integrated circuit includes a metal layer or interconnect layer 11 fabricated according to process 100 and a substrate 10. Portion 8 is preferably part of an ultra-large-scale integrated (ULSI) circuit having a million or more transistors. In an exemplary embodiment, portion 8 is manufactured as part of the IC on a semi-conductor wafer (e.g., a silicon wafer). Substrate 10 can be any type of IC substrate suitable for building a circuit including conductive lines.

Although portion 8 is shown with two metal or interconnect layers, the present disclosure is applicable to an integrated circuit having any number of metal or conductive layers, including a single metal layer or more than five metal layers. In addition, an interconnect layer or metal layer 13 can be fabricated according to process 100. In one embodiment, a conductive via such as a conductive via 54 can couple a conductive line 52 of interconnect layer 11 to a conductive line 56 of interconnect layer 13.

Conductive via 54 can be fabricated in accordance with process 100. In one embodiment, conductive via 54 is manufactured simultaneously with conductive line 56. Details of the structure of conductive via 54 are explained in more detail below with reference to FIG. 9.

A dielectric layer 18 is disposed above substrate 10 and can cover active devices or portions thereof. The active devices can include transistors, diodes or other devices. Layer 18 includes dielectric material 19 upon which layer 11 is provided. Layer 18 can be an interlevel dielectric layer (e.g., ILD 0).

Portion 8 includes interconnect layer 11, interconnect layer 13, interlevel dielectric layer 20 (ILD 1) and interlevel dielectric layer 12 (ILD 2). Layer 20 is provided between layers 11 and 13. Conductive via 54 can connect a conductive line 52 included in layer 11 to a conductive line 56 included in layer 13. In one embodiment, conductive via 54 is integral with conductive line 56.

Layer 11 is preferably manufactured in accordance with process 100 such that conductive line 52 includes a laminated structure including barrier materials and copper or copper alloys to reduce unconstrained void formation. The manufacture of layer 11 is described below with reference to FIGS. 3–8.

Layer 13, including conductive line 56, is preferably similar to layer 11 and manufactured according to the same process as layer 11. Layer 11 can include additional similar conductive lines such as line 53 which can be coupled to line 52, line 56, or other structures.

Conductive line 52 can be connected to other conductive lines and other conductive vias associated with portion 8. Layer 11 can be any type of layer including at least one conductive line such as line 52. In one embodiment, layer 11 is a copper interconnect layer (e.g., metal 1, metal 2, etc.). In another embodiment, a conductive via similar to conductive via 54 can connect layer 11 to structures or doped regions on substrate 10 or to other portions of layer 13.

Interlevel dielectric layer 20 can be an insulative layer or can be any of a variety of different materials into which diffusion or migration is undesirable. For example, interlevel dielectric layer 20 may be a phosphorous-silicate-glass (PSG), boron-silicate-glass (BSG), silicon dioxide ($SiO_2$), low dielectric constant materials, compound layers of insulative materials, or the like. Interlevel dielectric layer 20 may also include dopant elements such as fluorine (F), carbon (C), boron (B), phosphorous (P), silicon (Si) and nitrogen (N).

Conductive line 52 included in interconnect layer 11 can include copper (Cu), aluminum (Al), or any other conductive material used in the formation of lines, vias and the like in an integrated circuit. In an exemplary embodiment, conductive line 52 of metal layer 11 includes copper.

In a preferred embodiment, conductive lines 52 and 53 of metal layer 11 include layers of copper alloys and a barrier material. The copper alloys can include at least one of tin (Sn), zinc (Zn), calcium (Ca), chromium (Cr), zirconium (Zr), hafnium (Hf), lanthanum (La), barium (Ba), strontium (Sr), cadmium (Cd), silver (Ag), gold (Au), cobalt (Co), and nickel (Ni). The barrier layers can include at least one of tantalum (Ta), titanium silicon nitride (TiSiN), tungsten nitride (WN), tungsten (W), titanium (Ti), and $C_{ox}W_yP_z$. In an alternative embodiment, conductive lines 52 and 53 of interconnect layer 11 include thin layers of copper and tantalum.

Figure 3:
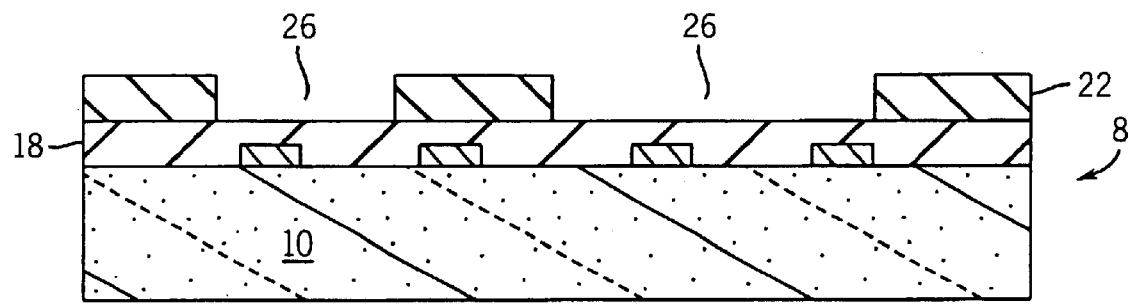
FIG. 3 is a schematic cross-sectional view of the portion illustrated in FIG. 2, showing a trench formation step.

With reference to FIG. 3, dielectric material 22 is deposited in step 102 (FIG. 1) above layer 18, Layer 22 can be deposited or formed by any conventional process. Preferably, layer 22 includes silicon dioxide and is deposited by chemical vapor deposition (CVD). According to one embodiment, layer 22 is an approxmiately 1,000 to 10,000 angstroms thick tetraethylorthosilicate (TEOS) deposited silicon dioxide layer.

After deposition, layer 22 is patterned and etched to form trenches 26 in step 104. Trenches 26 are used to form conductive lines 52 and 53 according to a damascene technique. Layer 22 can be etched in a dry etching process. Alternative removal processes can also be utilized to form trenches 26.

Figure 4:
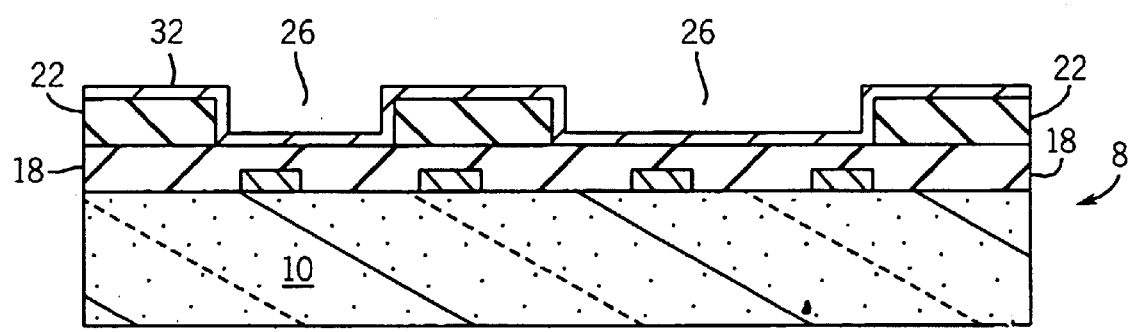
FIG. 4 is a schematic cross-sectional view of the portion illustrated in FIG. 2, showing a barrier layer formation step.

With reference to FIG. 4, a barrier layer 32 is deposited above layer 22 and in trenches 26 in step 106. Preferably, a conductive barrier material is provided as barrier layer 32. Preferably, barrier layer 32 is a 10–50 Å thick layer of tantalum. Layer 32 can be deposited by sputtering, non-aqueous electroplating, or chemical vapor deposition (CVD). Layer 32 is preferably chosen so that it adheres to layer 22. One type of barrier material which has shown greater adhesion to layer 22 is tantalum (Ta). Other barrier materials may include tantalum (Ta), tantalum nitride (TaN), tantalum silicon nitride (TaSiN), combinations thereof, and the like.

Layer 32 can be deposited in a number of ways including advanced sputtering techniques utilizing a barrier material target, electroless deposition, and combinations of advanced sputtering techniques and electrochemical depositions. Preferably, sputter deposition is utilized. Sputtering techniques (e.g., self-ionized placing (SIP), hollow cathode magnetron (HCM)) can be used at a starting pressure of approximately $1 \times 10^{-7}$ torr to form a highly effective barrier. In an alternative embodiment, an electrochemical barrier material such as electroless $C_{ox}W_yP_z$ or $C_{ox}W_yB_z$ alloys can be conformally deposited or sputtered to improve step coverage. In another alternative embodiment, a sputtered (e.g., SIP, HCM) tantalum barrier having a thickness of approximately 100 angstroms is formed on electroless $C_{ox}W_yP_z$ or $C_{ox}W_yB_z$ alloy material having a thickness of approximately 100 angstroms, which is in turn deposited on a cobalt nucleation layer having a thickness of between approximately 30 and 50 angstroms. Total thickness of this combined barrier layer may be between approximately 150 and 300 angstroms.

Figure 5:
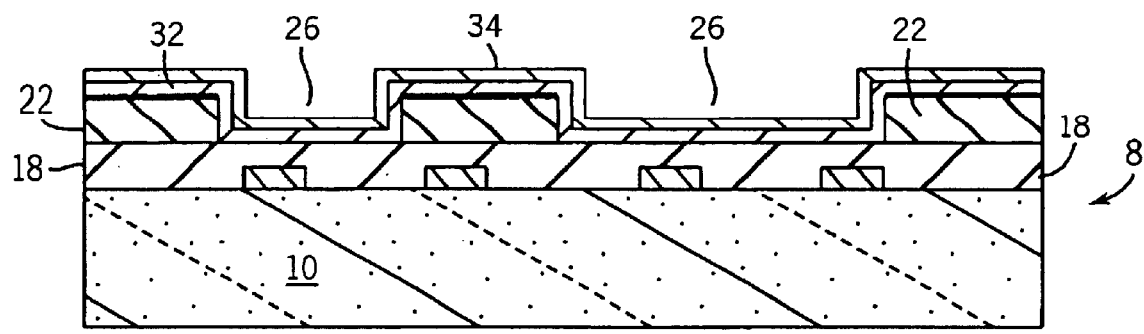
FIG. 5 is a schematic cross-sectional view of the portion illustrated in FIG. 2, showing a copper layer formation step.

With reference to FIG. 5, a copper layer 34 is deposited in step 108. Layer 34 is preferably deposited above layer 32 and within trenches 36. Layer 34 can be a 50–100 Å thick pure copper layer. Alternatively, layer 34 can be a copper alloy.

Similar to layer 32, layer 34 can be deposited using advanced sputtering techniques, electroless deposition, or combinations of advanced sputtering techniques and electrochemical depositions. Preferably, layer 34 is deposited by electrochemical depositions using different plating solutions in a multi-chamber plating device. Alternatively, if advanced sputtering techniques are utilized, alternating targets can be used to provide layers 32 and 34.

Figure 6:
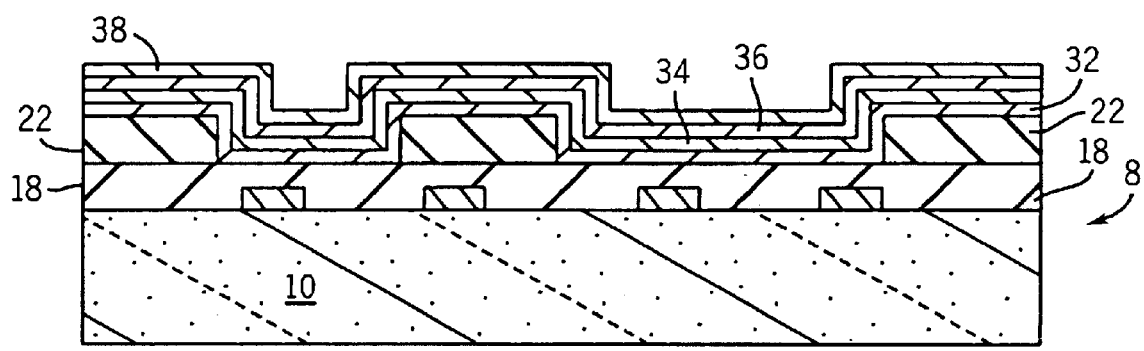
FIG. 6 is a schematic cross-sectional view of the portion illustrated in FIG. 2, showing another barrier layer formation step and another copper layer formation step.
Figure 7:
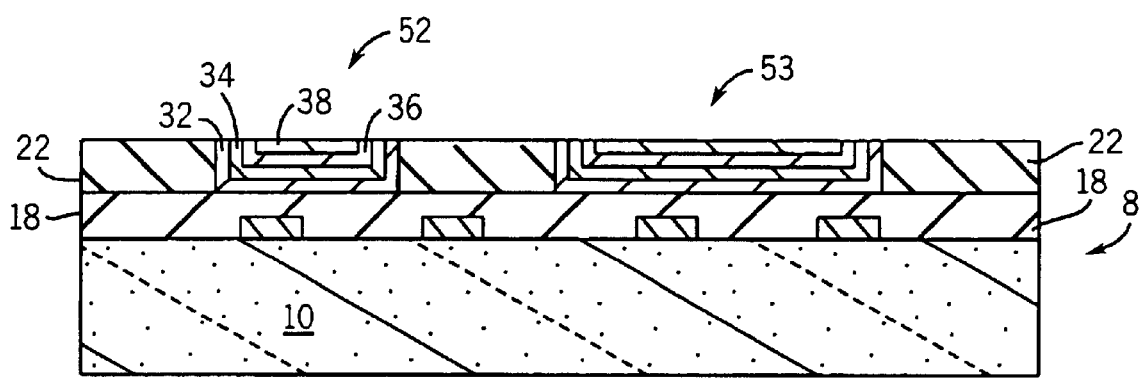
FIG. 7 is a schematic cross-sectional view of the portion illustrated in FIG. 2, showing a planarization step.

With reference to FIG. 6, a barrier layer 36 is provided above layer 34 and a copper layer 38 is provided above layer 36. Layer 36 can be a different material than layer 32. Layer 36 does not require the adhesion properties of layer 32, because it is not necessarily adjacent to a dielectric layer. Layer 38 can be a different material than layer 34 (e.g., layer 38 can be a copper alloy layer where layer 34 is pure copper). Layers 32, 34, 36, and 38 can also be deposited by different methods with respect to each other, depending upon desired characteristics.

Layers similar to layers 36 and 38 can be alternately deposited about portion 8 to achieve a laminated structure. Void and crack propagation is preferably stopped by inter-material boundaries associated with the laminated structure. Propagation of voids formed in the copper layer will cease when the void encounters a different grain structure in the adjacent barrier layer. The void growth will thus be constrained at the interface between the barrier layer and the copper layer by virtue of the different microstructure of the barrier layer. By constraining the void growth using a barrier layer, voids do not continue to grow through the entire conductive line, preventing an open circuit condition.

After deposition of the copper and barrier layers is completed, portion 8 is planarized at a step 120 to provide conductive lines 52 and 53 in trenches 26 (FIG. 2)

In a preferred embodiment, conductive lines 52 and 53 have a structure including three copper layers and two barrier layers. In one embodiment, lines 52 and 53 have two barrier layers between the three copper layers. In another embodiment, lines 52 have three barrier layers and three copper layers. Alternatively, other numbers of barrier layers and copper layers can be utilized. For example four barrier layers and three copper layers can be utilized.

Figure 8:
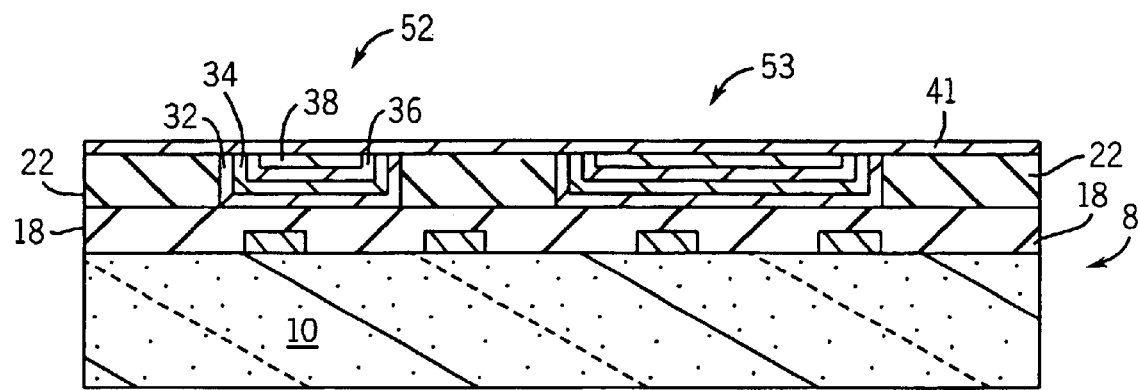
FIG. 8 is a schematic cross-sectional view of the portion illustrated in FIG. 2, showing a barrier layer formation step.

With reference to FIG. 8, a barrier layer 41 is provided above layer 22 and conductive lines 52 and 53. Layer 41 protects line 52 from electromigration and protects layer 20 (FIG. 1) from diffusion. Due to the cross-sectional U-shape of layers 32, 34, and 36, layer 41 prevents direct contact of copper in layer 34 with layer 20.

With reference to FIGURE,9, a more detailed drawing of conductive line 54 including conductive via 56 is shown. Conductive line 56 is provided in a trench in dielectric material 62. As shown in the embodiment in FIG. 9, conductive line 56 includes eight alternating layers of copper and barrier material.

Preferably, conductive line 56 includes pure copper layers provided with alternating layers of tantalum barrier materials. Alternatively, other materials can be utilized for both the copper layers and the barrier layers. The layers in line 56 can be similar to layers 32, 34, 36, and 38 discussed above with reference to FIGS. 2–8. Conductive line 56 and layer 22 can also be covered with an additional barrier material similar to barrier layer 41 (FIG. 8).

Figure 9:
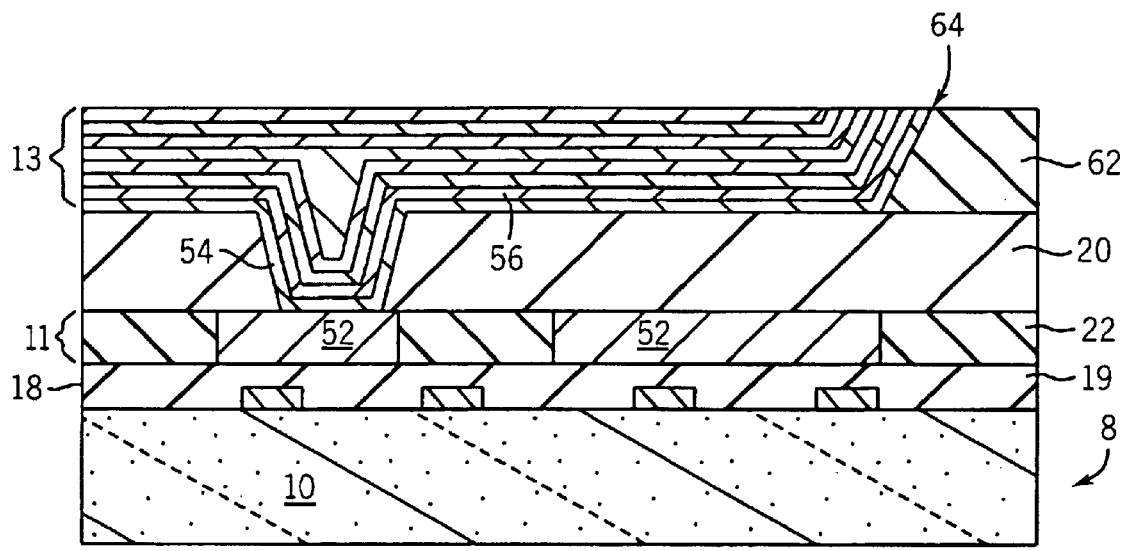
FIG. 9 is a schematic cross-sectional view of a portion of the portion of the integrated circuit illustrated in FIG. 2, showing a laminated conductive line including a via in accordance with another exemplary embodiment.

In FIG. 9, conductive via 54 is integral with conductive line 56 and includes one or more layers with a V-shape or U-shaped cross section. In addition, the layers of conductive line 56 are parallel with an edge 64 of the trench associated with material 62. In this way, the laminated structure prevents diffusion into material 62 due to the use of a bottom barrier layer. The side of trench 62 can have an angle of between approximately 85 and 90 degrees. A barrier layer similar to layer 41 can protect dielectric layer 12 form the terminated ends of the alternating layers at edge 64. An end on the other side of the trench associated with material 62 can be similar to end 64 including layers substantially parallel with the side wall of the trench.

While the above exemplary embodiments have been described with regard to a damascene copper metal line process, other line formation processes can be utilized. For example, line 52 can be fabricated in a dual damascene process. Further, system parameters and design criteria can affect the selection of materials and line thicknesses without departing from the scope of the invention. For example, adhesion parameters; trench steps, etc. can determine the types of materials and, number of layers and thicknesses of layers associated with the conductive line.

While the exemplary embodiments illustrated in the FIGURES and described above are presently preferred, it should be understand that these embodiments are offered by way of example only. Other embodiments may include, for example, different deposition methods or different alloys. The invention is not limited to a particular extends to various modifications, combinations, and permutations that nevertheless fall within the scope and spirit of the appended claims.

What is claimed is:

1. An integrated circuit, the integrated circuit comprising at least one interconnect layer, the interconnect layer including a plurality of conductive lines, each of the conductive lines comprising at least three pairs of a first layer containing copper and a second layer containing a barrier material.

2. The integrated circuit of claim 1, wherein each of the conductive lines is disposed in a trench in a dielectric material.

3. The integrated circuit of claim 2, wherein at least one of the conductive lines extends into a second trench to form a conductive via, the pairs having a V-shaped or U-shaped cross-sectional area at a point where the pairs extends into the second trench.

4. The integrated circuit of claim 1, wherein the second layer is beneath the first layer and the first layer of an uppermost pair is covered by a barrier layer.

5. The integrated circuit of claim 4, wherein the barrier material in the second layer comprises tantalum.

6. The integrated circuit of claim 4, wherein the barrier layer covering the uppermost pair is insulative and the barrier material in the second layer is conductive.

7. The integrated circuit of claim 1, wherein the trench includes a first side and a second side, wherein one of the pairs has a first portion parallel to a bottom of the trench and a second portion parallel to the first side or the second side.

8. The integrated circuit of claim 7, wherein the first portion and the second portion are substantially perpendicular.

9. A laminated conductive line for an interconnect layer of an integrated circuit, the laminated conductive line comprising:
   a first barrier layer above a bottom of a dielectric trench;
   a first copper layer above and in contact with the first barrier layer;
   a second barrier layer above and in contact with the first copper layer;
   a second copper layer above and in contact with the second barrier layer;
   a third barrier layer above and in contact with the second copper layer; and
   a third copper layer above and in contact with the third barrier layer;
   whereby the conductive line includes three copper layers and three barrier layers.

10. The laminated conductive line of claim 9, further comprising a fourth barrier layer above and in contact with the third copper layer.

11. The laminated conductive line of claim 9, wherein the trench includes a via trench, the first barrier layer, the fist copper layer, the second barrier layer and the second copper layer extending into the via trench.

12. The laminated conductive line of claim 11, wherein portions of the first barrier layer, the first copper layer, the second barrier layer and the second copper layer extending into the via trench have a U-shaped or V-shaped cross-sectional area.

13. The laminated conductive line of claim 9, wherein the first barrier layer and the second barrier layer are tantalum layers.

14. The laminated conductive line of claim 9, wherein the first barrier layer and the second barrier layer are different materials.

15. The laminated conductive line of claim 9, wherein the trench includes a first side and a second side, wherein the first barrier layer, the first copper layer, the second barrier layer and the second copper layer have a first portion parallel to a bottom of the trench and a second portion parallel to the first side or the second side.

16. An integrated circuit having a plurality of conductive lines, the integrated circuit comprising:
   a trench provided in a dielectric material; and
   at least a portion of a conductive line provided in the trench, the conductive line comprising:
      a first barrier metal layer;
      a first layer comprising copper provided in contact with the first barrier metal layer;
      a second barrier metal layer provided in contact with the first copper layer;
      a second layer comprising copper provided in contact with the second barrier metal layer;
      a third barrier metal layer provided in contact with the second layer comprising copper; and
      a third layer comprising copper provided in contact with the third barrier metal layer.

17. The integrated circuit of claim 16, wherein at least one of the first barrier metal and the second barrier metal comprise tantalum.

18. The integrated circuit of claim 16, further comprising a fourth barrier metal layer provided in contact with the third layer comprising copper.

19. The integrated circuit of claim 1, wherein at least one of at least three pairs includes a layer containing copper that also comprises at least one of zinc, calcium, chromium, zirconium, and hafnium.

20. The integrated circuit of claim 1, wherein at least one of at least three pairs includes a layer containing copper that also comprises at least one of lanthanum, barium, strontium, cadmium, cobalt, and nickel.

21. The laminated conductive line of claim 9, wherein at least one of the copper layers comprises a copper alloy comprising at least one of zinc, calcium, chromium, zirconium, hafnium, lanthanum, barium, strontium, cadmium, cobalt, and nickel.

22. The laminated conductive line of claim 9, wherein at least one of the copper layers comprises a copper alloy comprising at least one of zinc, calcium, chromium, zirconium, cobalt, and nickel.

23. The integrated circuit of claim 16, wherein at least one of the layers comprising copper further comprises one of zinc, calcium, chromium, zirconium, hafnium, lanthanum, barium, strontium, cadmium, cobalt, and nickel.

24. The integrated circuit of claim 16, wherein at least one of the layers comprising copper further comprises at least two elements selected from zinc, calcium, chromium, zirconium, hafnium, lanthanum, barium, strontium, cadmium, cobalt, and nickel.

* * * * *